(12) United States Patent
Ker et al.

(10) Patent No.: US 7,632,725 B2
(45) Date of Patent: Dec. 15, 2009

(54) METHOD OF FORMING ESD PROTECTION DEVICE WITH THICK POLY FILM

(75) Inventors: Ming-Dou Ker, Hsinchu (TW); Chih-Kang Deng, Taipei (TW); Tang-Kui Tseng, Hsinchu (TW); An Shih, Changhua (TW); Sheng-Chieh Yang, Taoyuan (TW)

(73) Assignee: TPO Displays Corp. (TW)

( * ) Notice: Subject to any disclaimer, the term of this patent is extended or adjusted under 35 U.S.C. 154(b) by 602 days.

(21) Appl. No.: 11/451,344

(22) Filed: Jun. 13, 2006

(65) Prior Publication Data

US 2006/0231896 A1 Oct. 19, 2006

Related U.S. Application Data

(62) Division of application No. 10/829,983, filed on Apr. 23, 2004, now abandoned.

(30) Foreign Application Priority Data

Apr. 25, 2003 (TW) .............................. 92109702 A

(51) Int. Cl.
*H01L 21/00* (2006.01)
(52) U.S. Cl. ...................................... 438/155
(58) Field of Classification Search ............... 438/155
See application file for complete search history.

(56) References Cited

U.S. PATENT DOCUMENTS 5,572,061 A * 11/1996 Chen et al. .................. 257/530
6,114,197 A 9/2000 Hsu
6,448,114 B1 * 9/2002 An et al. .................... 438/142
6,879,000 B2 * 4/2005 Yeo ............................ 257/347
2002/0033504 A1 * 3/2002 Ohnakado .................. 257/350

FOREIGN PATENT DOCUMENTS

| JP | 63-115360 | 4/1986 |
| JP | 1194351 | 8/1989 |
| JP | 11-326948 | * 11/1999 |
| JP | 2001209026 | 8/2001 |

* cited by examiner

*Primary Examiner*—Evan Pert
(74) *Attorney, Agent, or Firm*—Stevens Law Group; David R. Stevens

(57) ABSTRACT

An ESD protection device with thicker polysilicon film, an electronic apparatus having the same, and a method for manufacturing the same are provided. The ESD protection device can be a diode or a MOS transistor with a thicker polysilicon film employed in an ESD protection circuit to protect an electronic apparatus. The electronic apparatus includes a substrate having a device area and an ESD protection circuit area. A first polysilicon film of a first thickness is formed on the device area of the substrate, so as to form an electronic device. A second polysilicon film of a second thickness is formed on the ESD protection circuit area, so as to form an ESD protection device. The second thickness, which is preferably about in the range of 100 to 500 nanometers, is thicker than the first thickness.

6 Claims, 5 Drawing Sheets

METHOD OF FORMING ESD PROTECTION DEVICE WITH THICK POLY FILM

This application is a division of U.S. patent application Ser. No. 10/829,983, filed Apr. 23, 2004 now abandoned.

CROSS REFERENCE TO RELATED APPLICATIONS

This application claims priority to Taiwan Patent Application No. 092109702 entitled "ESD Protection Device with Thick Poly Film, Electronic Device and Method for Forming the Same", filed on Apr. 25, 2003.

FIELD OF INVENTION

The present invention generally relates to an ESD protection device and, more particularly, to an ESD protection device with thicker polysilicon film in an electronic apparatus, and method for forming the same.

BACKGROUND OF THE INVENTION

Thin-film transistors (TFTs) are commonly used in most semiconductor electronic apparatus as switches in active matrix liquid crystal displays, image sensors or the like. However, applications of TFT devices have limitations. For example, in the process of manufacturing liquid crystal displays, when glass or quartz substrates are delivered or processed on the production line, TFT devices generally accumulate a large number of charges and introduce electrostatic discharge (ESD) damage because of their random grains and large resistance. It is therefore very important to provide ESD protection circuits around the input and output (I/O) pads to increase the production yield.

However, as shown in FIG. 1A, when a positive discharge voltage is applied to the output pad (Drain) with the Vss pad (Source) relatively grounded, the ESD protection device 10, such as a reverse diode at the drain, is stressed by the ESD voltage and breaks down, which results in the clamp of the overstress voltage on the pad. Furthermore, when the heat induced by the ESD is larger than that the ESD protection device can sustain, the ESD protection device will be damaged. There is therefore more and more research investigating behavior of TFT devices during ESD, most of which focuses on the resultant damage and the damage mechanisms. For example, in order to sustain larger ESD currents, increasing the area of device is proposed to promote the breakdown voltage. However, as shown in FIG. 1B, when the channel length reaches a certain value, such as 10 μm, the breakdown voltage stays constant with an approximate value of 430V.

Therefore, there is a need to provide an ESD protection device with increased robustness to sustain higher ESD currents and prevent the electronic apparatus from damage.

SUMMARY OF THE INVENTION

It is one aspect of the present invention to provide an ESD protection device which has a thicker polysilicon film than that of general semiconductor electronic devices, and therefore the robustness of the ESD protection device, such as a diode or a MOS transistor, is enhanced.

It is another aspect of the present invention to provide an ESD protection device with a polysilicon film having a thickness in a range of about 100 to 500 nanometers, which can sustain higher currents so as to protect internal circuits from damage.

The present invention provides an ESD protection device including a substrate and a polysilicon film in an ESD protection circuit to protect an electronic apparatus. The polysilicon film of a thickness in a range of about 100 to 500 nanometers is formed on the substrate. The ESD protection device can be a MOS transistor or a diode.

In one embodiment, the ESD protection device is a MOS transistor, which further includes source/drain regions, a gate dielectric layer, and a gate electrode. The source/drain regions are formed in the polysilicon film and separated by a channel. In another embodiment, the ESD protection device is a diode, which further includes an n-type doped region and a p-type doped region in the polysilicon film. For example, the n-type doped region is adjacent to the p-type doped region to form a PN diode. In a further embodiment, the diode further includes an intrinsic region between the n-type doped and p-type doped regions so as to form a PIN diode.

It is a further another aspect of the present invention to provide an electronic apparatus with an ESD protection device of thicker polysilicon film, which includes a substrate, a first polysilicon film, and a second polysilicon film. The substrate has a device area and an ESD protection circuit area. The first polysilicon film having a first thickness is formed on the device area so as to form an electronic device. The second polysilicon film having a second thickness is formed on the ESD protection circuit area so as to form the ESD protection device. The second thickness is larger than the first thickness and preferably in a range of about 100 to 500 nanometers. The electronic device can be a MOS transistor while the ESD protection device can be a diode or a MOS transistor.

It is another aspect of the present invention to provide a method compatible with the current process flow to form an ESD protection device, which is capable of sustaining higher power heat so as to prevent electronic apparatus from damage.

In one embodiment, the method includes steps of providing a substrate having a device area and an ESD protection circuit area, forming a first polysilicon film of a first thickness on the device area of the substrate so as to form an electronic device, and forming a second polysilicon film of a second thickness on the ESD protection circuit area of the substrate so as to form the ESD protection device. The second thickness is larger than the first thickness and preferably in a range of about 100 to 500 nanometers.

In an exemplary embodiment, the step of forming the first and second polysilicon films includes steps of forming the second polysilicon film on the substrate to cover the device area and the ESD protection circuit area, forming a patterned photoresist layer on the second polysilicon layer to expose a portion of the second polysilicon film corresponding to the device area, and etching the second polysilicon film to reach the first thickness by using the patterned photoresist layer as a mask.

In another exemplary embodiment, the step of forming the first and second polysilicon films includes steps of forming a polysilicon film of a third thickness on the substrate to cover the device area and the ESD protection circuit area, forming a patterned photoresist layer on the polysilicon film to expose a portion of the polysilicon film corresponding to the device area, etching the polysilicon film to expose the substrate by using the patterned photoresist layer as a mask, removing the patterned photoresist layer, and depositing the first polysilicon film on the substrate. As a result, the second thickness equals the third thickness plus the first thickness.

The method further includes other steps of forming a diode or a MOS transistor as the ESD protection device. For example, an n-type doped region and a p-type doped region are formed in the second polysilicon film so as to form a PN diode. Furthermore, an intrinsic region is formed between the n-type doped and p-type doped regions so as to form a PIN diode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

The present invention provides an electrostatic discharge (ESD) protection device, which has thicker polysilicon film to enhance the robustness so as to sustain higher currents or power heat.

Figure 1A:
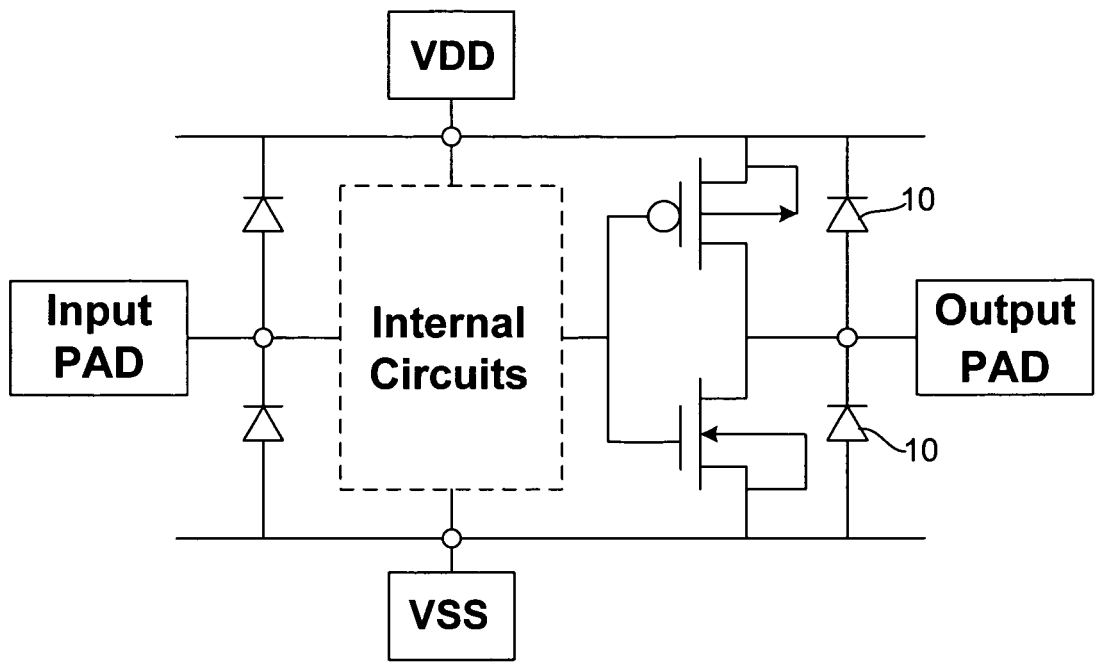
FIG. 1A illustrates a conventional ESD protection circuit.
Figure 1B:
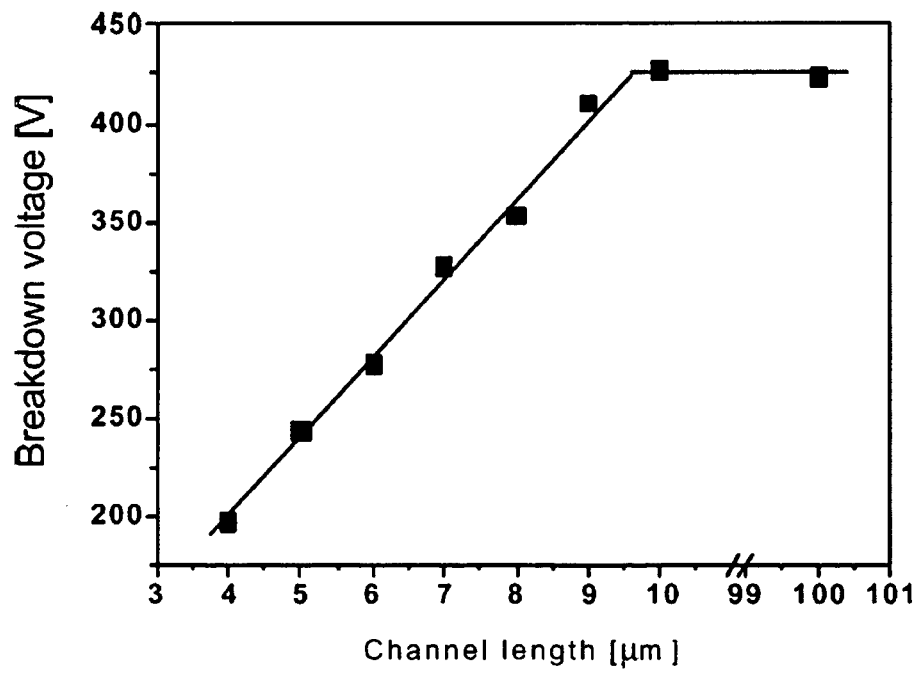
FIG. 1B illustrates a diagram showing relation between channel width and breakdown voltage of a conventional ESD protection device.
Figure 2:
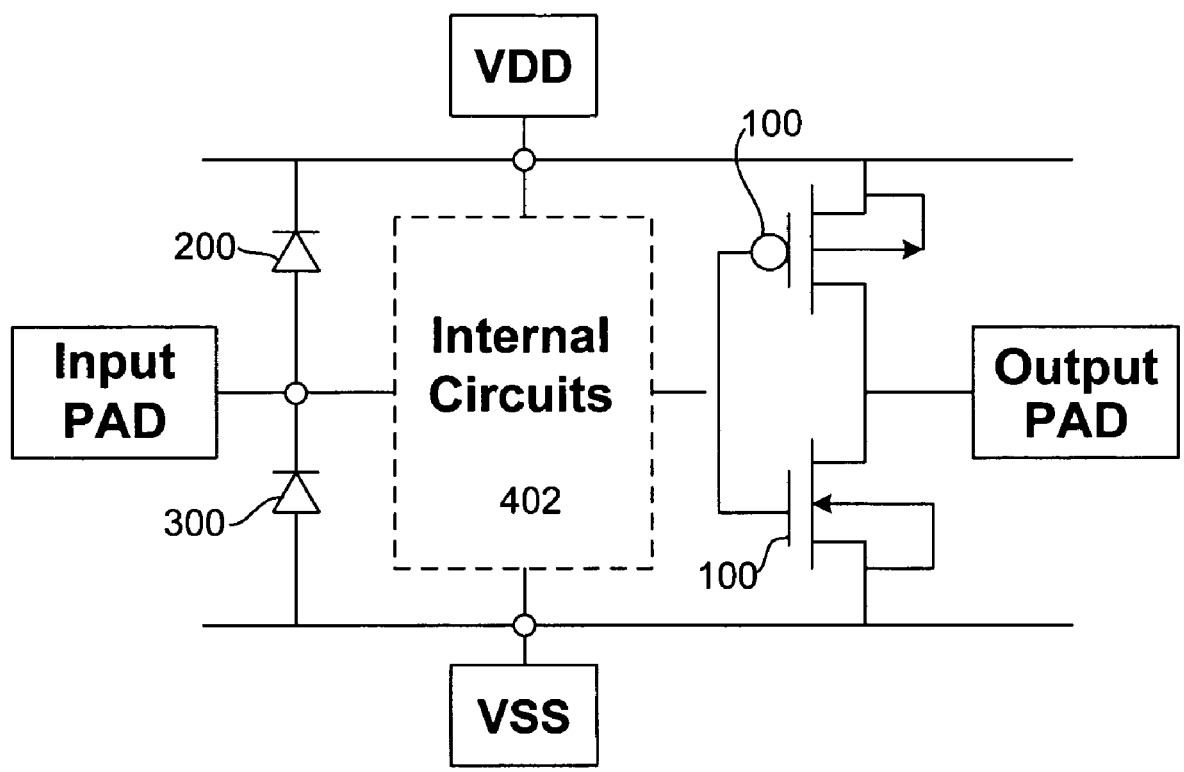
FIG. 2 illustrates an ESD protection circuit in one embodiment of the present invention.
Figure 3A:
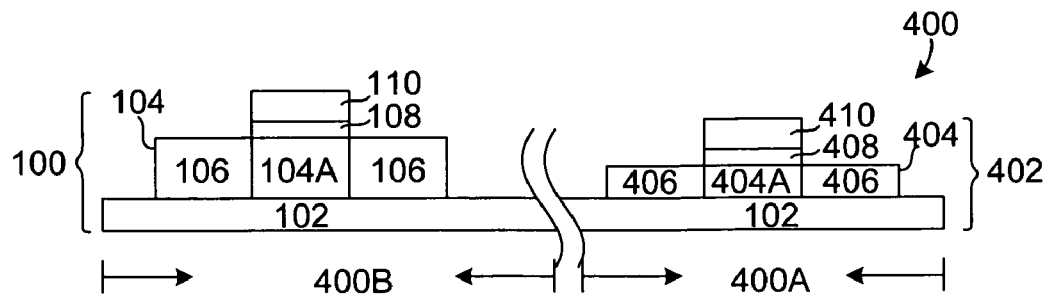
FIG. 3A illustrates a cross-sectional view of an ESD protection device and an electronic device in a first embodiment of the present invention.
Figure 3B:
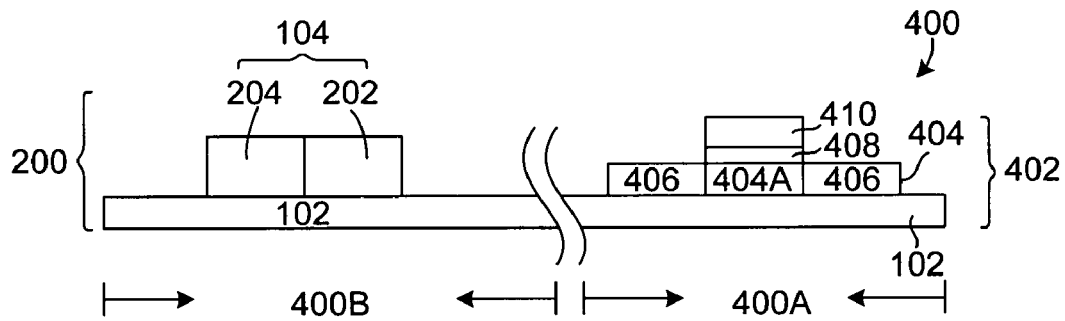
FIG. 3B illustrates a cross-sectional view of an ESD protection device and an electronic device in a second embodiment of the present invention.
Figure 3C:
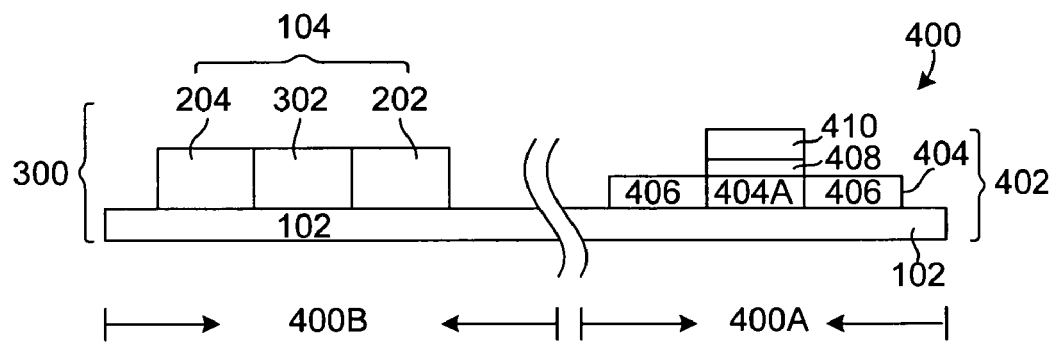
FIG. 3C illustrates a cross-sectional view of an ESD protection device and an electronic device in a third embodiment of the present invention.

FIG. 2 illustrates ESD protection devices having thick polysilicon films (such as 100, 200, and 300) in I/O pads of an electronic apparatus 400 so as to provide electrostatic discharge protection to the electronic apparatus 400 in one embodiment of the present invention. FIGS. 3A to 3C illustrate cross-sectional views of exemplary embodiments of the present invention.

Referring to FIGS. 2 and 3A, in a first exemplary embodiment, the present invention provides an ESD protection device 100, such as a MOS transistor, in an ESD circuit so as to protect the electronic apparatus 400. The ESD protection device 100 includes a substrate 102 and a polysilicon film 104. The substrate 102 can be selected from a group consisting of glass substrate, a quartz substrate, and the combination thereof. The polysilicon film 104 having a thickness in a range of about 100 to 500 nanometers is formed on the substrate 102. Source/drain regions 106 are formed in the polysilicon film 104 and separated by a channel 104A. The ESD protection device 100 further includes a gate dielectric layer 108, such as gate oxide layer, and a gate electrode 110, so as to be a MOS transistor used in an ESD protection circuit.

Referring to FIG. 3B, in a second exemplary embodiment, the ESD protection device 200 is a diode, which includes a substrate 102 and a polysilicon film 104. Similarly, the substrate 102 can be selected from a group consisting of a glass substrate, a quartz substrate, and the combination thereof. The polysilicon film 104, which has a thickness in a range of about 100 to 500 nanometers, is formed on the substrate 102. An n-type doped region 202 and a p-type doped region 204 are formed in the polysilicon film 104. The ESD protection device 200 can be a PN diode when the n-type doped region 202 is adjacent to the p-type doped region 204.

Referring to FIG. 3C, in a third exemplary embodiment, the difference between he second and third embodiments is that ESD protection device 300 further includes an intrinsic region 302, which is arranged between the n-type and p-type doped regions, 202 and 204, to form a PIN diode as the ESD protection device 300.

Referring to FIGS. 2 and 3A to 3C, the electronic apparatus 400 having the ESD protection device shown as 100, 200, or 300, includes a substrate 102, a first polysilicon film 404, and a second polysilicon film 104. As described above, the substrate 102 can be selected from a group consisting of a glass substrate, a quartz substrate, and the combination thereof. The substrate 102 has a device area 400A and an ESD protection circuit area 400B. The device area 400A can be an internal circuit region as shown in FIG. 2. The first polysilicon film 404 having a first thickness (H1) is formed on the device area 400A of the substrate 102, so as to form an electronic device 402. The second polysilicon film 104 having a second thickness (H2) is formed on the ESD protection circuit area 400B of the substrate 102, so as to form an ESD protection device (such as 100, 200, or 300). The second thickness (H2) is larger than the first thickness (H1) and preferably in a range of about 100 to 500 nanometers.

The electronic device 402 can be a p-type or n-type MOS transistor, and therefore, the electronic device 402 further includes first source/drain regions 406 formed in the first polysilicon film 402 and separated by a first channel 404A. A gate dielectric layer 408 and gate electrode 410 are formed on the first polysilicon film 404. The ESD protection device can be a diode (such as 200 or 300) or a MOS transistor 100 having a thicker polysilicon film 104. For example, as a MOS transistor 100, the ESD protection device 100 further includes second source/drain regions 106 formed in the second polysilicon film 104 and separated by a second channel 104A. Gate dielectric layer 108 and gate electrode 110 are formed on the second polysilicon layer 104, as shown in FIG. 3A.

Alternatively, the electronic apparatus 400 further includes an n-type doped region 202 and a p-type doped region 204 in the second polysilicon film 104 so as to form a PN diode as the ESD protection device 200 in FIG. 3B. Moreover, an intrinsic region 302 can be formed between the n-type and p-type doped regions (202 and 204) to form a PIN diode as the ESD protection device 300 in FIG. 3C.

In general, a conventional ESD protection device has a polysilicon film of a thickness, preferably about 50 nanometers, which is the same as that of the active area of the electronic device in the internal circuit (such as 404 in FIGS. 3A-3C), so that the gate can have better controls over the channel. However, the application of thin polysilicon film is not suitable for ESD events. Therefore, the ESD protection device of the present invention, such as 100, 200, and 300, having a thicker polysilicon film (preferably in a range between 100 to 500 nanometers) can efficiently disperse the ESD currents to the thick polysilicon film 104 and improve the robustness of the ESD protection device. Moreover, as shown in FIG. 2, when ESD event happens in PS mode or ND mode, passing through the I/O pads, the ESD protection device with thicker polysilicon film can sustain large currents to protect devices from damage.

Figure 4:
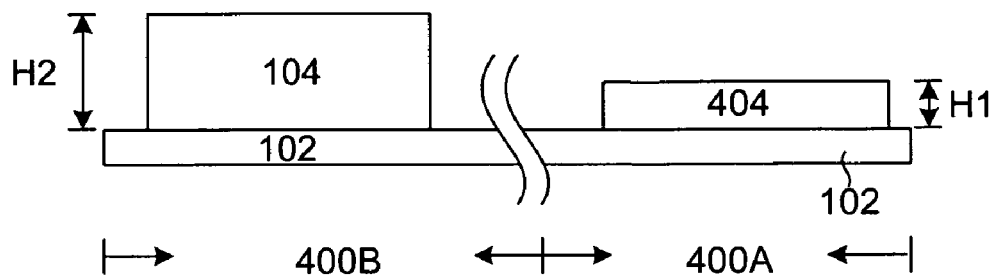
FIG. 4 illustrates a cross-sectional view of polysilicon films in one embodiment of the present invention.

Referring to FIG. 4, in another embodiment, a method for forming an ESD protection device in an ESD protection circuit is provided. The method includes a step of providing a substrate 102, which has a device area 400A and an ESD protection circuit area 400B. A first polysilicon film 404 of a first thickness (H1) is formed on the device area 400A of the substrate 102 so as to form an electronic device 402 (as shown in FIGS. 3A to 3C). A second polysilicon film 104 of a second thickness (H2) is formed on the ESD protection circuit area 400B of the substrate 102 to form the ESD protection device (such as 100, 200, and 300 shown in FIGS. 3A to 3C). The second thickness (H2) is larger than said first thickness (H1) and preferably in a range about 100 to 500 nanometers.

Figure 5A:
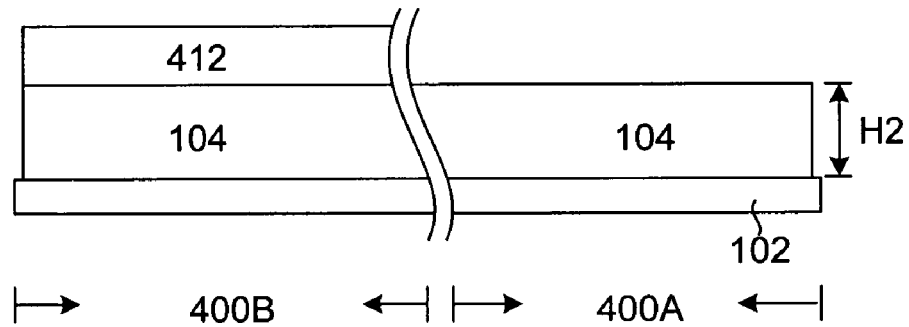
FIGS. 5A and 5B illustrates a cross-sectional view of forming a first and second polysilicon films in one embodiment of the present invention.
Figure 5B:
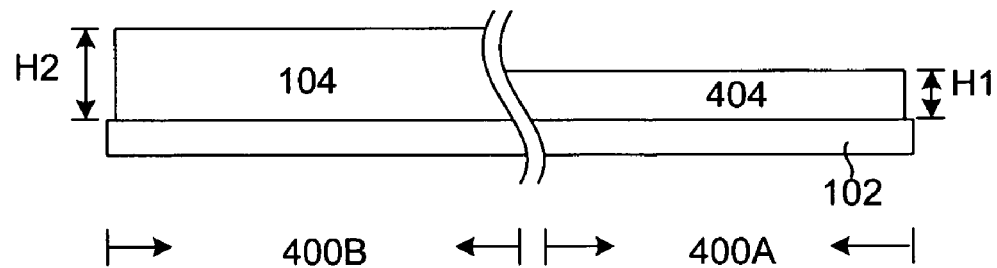

It is noted that the steps of forming the first and second polysilicon films (404 and 104) include variety combinations of processes. For example, as shown in FIGS. 5A and 5B, the steps of forming the first and second polysilicon films include forming the second polysilicon film 104 over the entire substrate 102. In other words, the second polysilicon film 104 having the second thickness (H2) covers the device area 400A and the ESD protection circuit area 400B. Then, a pattern photoresist layer 412 is formed on the second polysilicon film 104 to expose a portion of the second polysilicon film 104, which corresponds to the device area 400A. The second polysilicon film 104 is etched to reach the first thickness (H1) by using the patterned photoresist layer 412 as a mask. Therefore, the first and second polysilicon films are formed.

Figure 6A:
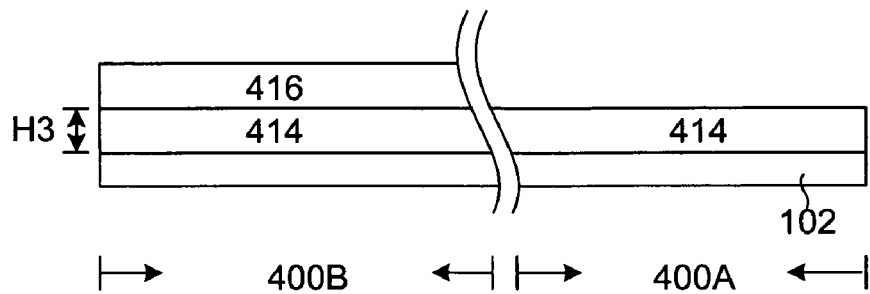
FIGS. 6A-6C illustrates a cross-sectional view of forming a first and second polysilicon films in another embodiment of the present invention.
Figure 6B:
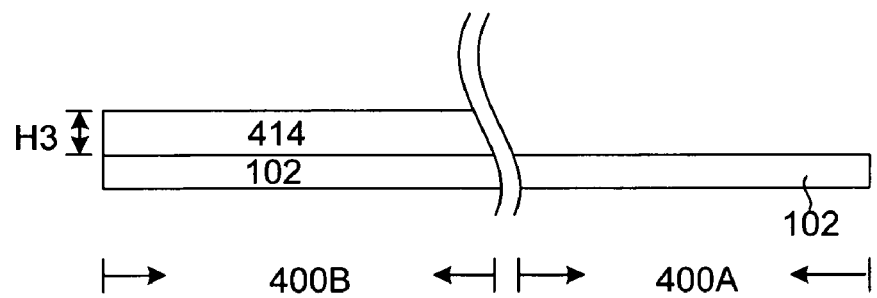
Figure 6C:
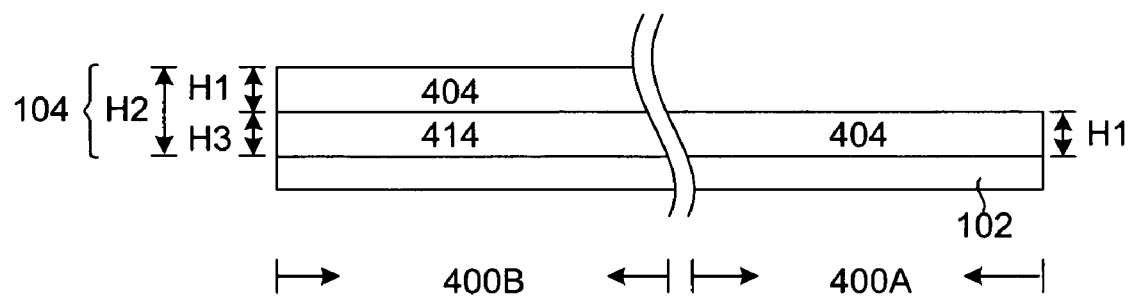

In another exemplary embodiment, as shown in FIGS. 6A to AB, the step of forming the first and second polysilicon films includes forming a polysilicon film 414 of a third thickness (H3) on the entire substrate 102 to cover the device area 400A and the ESD protection circuit area 400B. Then, a patterned photoresist layer 416 is formed on the polysilicon film 414 to expose a portion of the polysilicon film 414, which corresponds to the device area 400A, as shown in FIG. 6A. The polysilicon film 414 is etched to expose a portion of the substrate 102 by using the patterned photoresist layer 416 as a mask. Then, the patterned photoresist layer 416 is removed, as shown in FIG. 6B. The first polysilicon film 404 is deposited on the substrate 102. It is noted that the second thickness (H2) equals the third thickness (H3) plus said first thickness (H1), as shown in FIG. 6C. According to different design needs, the method may further include a step of defining active areas to accomplish the structure shown in FIG. 4.

The method further includes steps of forming diodes or MOS transistors, which is compatible with current process flow of forming thin-film transistors. As shown in FIG. 3A, the method further includes forming first source/drain regions 406 of electronic device 402. The source/drain regions 406 are separated by a fist channel 404A in the first polysilicon film 404. When the ESD protection device is a MOS transistor 100, the method further includes a step of forming second source/drain regions 106 separated by a second channel 104A in the second polysilicon film 104. Therefore, the thicker polysilicon film 104 can sustain higher power heat to prevent the ESD protection device 100 from damage.

Alternatively, the method further includes forming n-type and p-type doped regions 202 and 204, so as to form the ESD protection device 200 (PN diode as shown in FIG. 3B). Moreover, the method further includes forming an intrinsic region 302 between the n-type doped region 202 and the p-type doped region 204 in the second polysilicon film 104 to form a PIN diode 300 as the ESD protection device.

It is noted that the polysilicon film 104, 404, or 414 can be formed by conventional technologies including deposition, photolithography, etch, and the like. Similarly, the source/drain regions (106 and 406) or the n/p type doped regions (202 and 204) can be formed by conventional technologies such as diffusion or ion implant processes, which are not elaborated.

Although specific embodiments have been illustrated and described, it will be obvious to those skilled in the art that various modifications may be made without departing from what is intended to be limited solely by the appended claims.

What is claimed is:

1. A method for forming an ESD protection device in an ESD protection circuit, comprising:
   providing a substrate having a device area and an ESD protection circuit area;
   forming a first polysilicon film of a first thickness on said substrate to cover said device area and said ESD protection circuit area;
   forming a patterned photoresist layer on said first polysilicon film to expose a portion of said first polysilicon film corresponding to said device area;
   etching said first polysilicon film to expose said substrate by using said patterned photoresist layer as a mask;
   removing said patterned photoresist layer; and
   depositing a second polysilicon film of a second thickness on said substrate so as to form a polysilicon film on said device area having the second thickness and a polysilicon film on said ESD protection circuit area having a third thickness, wherein said third thickness equals said first thickness plus said second thickness.

2. The method according to claim 1, further comprising forming first source/drain regions separated by a first channel in said polysilicon film on said device area.

3. The method according to claim 2, further comprising forming second source/drain regions separated by a second channel in said polysilicon film on said ESD protection circuit area.

4. The method according to claim 1, further comprising forming an n-type doped region and a p-type doped region in said polysilicon film to form a PN diode on said ESD protection circuit area.

5. The method according to claim 4, further comprising forming an intrinsic region between said n-type doped region and said p-type doped region in said third polysilicon film to form a PIN diode.

6. The method according to claim 1, wherein said third thickness is in a range of about 100 to 500 nanometers.

* * * * *